(12) United States Patent
Cheng et al.

(10) Patent No.: US 8,377,755 B2
(45) Date of Patent: Feb. 19, 2013

(54) METHOD FOR FABRICATING SOI HIGH VOLTAGE POWER CHIP WITH TRENCHES

(75) Inventors: Xinhong Cheng, Shanghai (CN); Zhongjian Wang, Shanghai (CN); Yuehui Yu, Shanghai (CN); Dawei He, Shanghai (CN); Dawei Xu, Shanghai (CN); Chao Xia, Shanghai (CN)

(73) Assignee: Shanghai Institute of Microsystem and Information Technology, Chinese Academy of Sciences, Changning District Shanghai (CN)

( * ) Notice: Subject to any disclaimer, the term of this patent is extended or adjusted under 35 U.S.C. 154(b) by 67 days.

(21) Appl. No.: 13/133,886

(22) PCT Filed: Sep. 7, 2010

(86) PCT No.: PCT/CN2010/076671
§ 371 (c)(1),
(2), (4) Date: Jun. 9, 2011

(87) PCT Pub. No.: WO2012/003658
PCT Pub. Date: Jan. 12, 2012

(65) Prior Publication Data
US 2012/0009740 A1 Jan. 12, 2012

(30) Foreign Application Priority Data

Jul. 6, 2010 (CN) .......................... 2010 1 0220360

(51) Int. Cl.
*H01L 21/332* (2006.01)
(52) U.S. Cl. ........ 438/135; 438/163; 438/311; 438/316; 438/335; 257/134; 257/138; 257/340; 257/347; 257/348; 257/E21.382; 257/E21.427; 257/E21.435; 257/E29.027; 257/E29.066
(58) Field of Classification Search .................. None
See application file for complete search history.

*Primary Examiner* — Julio J Maldonado
*Assistant Examiner* — Yasser Abdelaziez
(74) *Attorney, Agent, or Firm* — Global IP Services; Tianhua Gu

(57) ABSTRACT

A method of manufacturing a SOI high voltage power chip with trenches is disclosed. The method comprises: forming a cave and trenches at a SOI substrate; filling oxide in the cave; oxidizing the trenches, forming oxide isolation regions for separating low voltage devices at the same time; filling oxide in the oxidized trenches; and then forming drain regions, source regions and gate regions for a high voltage power device and low voltage devices. The process involves depositing an oxide layer overlapping the cave of the SOI substrate. A SOI high voltage power chip thus made will withstand at least above 700V voltage.

7 Claims, 3 Drawing Sheets

METHOD FOR FABRICATING SOI HIGH VOLTAGE POWER CHIP WITH TRENCHES

CROSS REFERENCE TO RELATED PATENT APPLICATION

The present application is the US national stage of PCT/CN2010/076671 filed on Sep. 7, 2010, which claims the priority of the Chinese patent application No. 201010220360.4 filed on Jul. 6, 2010, which application is incorporated herein by reference.

FIELD OF THE INVENTION

The present invention relates to a method for fabricating SOI high voltage power chip, and in particular, to a method of fabricating SOI high voltage power chip having isolation trenches.

BACKGROUND OF THE INVENTION

Power integrated circuit, or high voltage integrated circuit, is an important branch of modern electronics. It provides new type of circuits for various power converters and energy treatment device, capable of high speed, high integration density, low power consumption and radiation-hardness. Power integrated circuit is widely used in power control systems, automotive electronics, display drivers, communication devices, lighting industry, national defense, aerospace, and many other important areas. Because they are widely used, high voltage devices being the core of power integrated circuit are subject to strict requirements.

A power integrated circuit includes high voltage power transistors, conversion controllers, single-chip logic devices, etc. There high voltage power devices and low voltage logic devices have to be integrated on one chip. Silicon on insulator (SOI), being an ideal isolation material, can isolate high power modules from low power modules, and isolate high voltage devices from low voltage devices as well. Therefore, SOI eliminates electrical interference and simplifies device structures in a power IC. Furthermore, the surface of isolation regions in SOI is smaller than junction isolation regions, thus using SOI power IC can shrink chip area and reduce parasitic capacitance, making device scaling relatively easy.

IC products with SOI power devices operating at higher than 600V are widely used in fluorescent lamps, switching power supply controllers, and other devices. However, the vertical breakdown voltage of a conventional SOI high voltage device is lower than that for bulk silicon high voltage power devices, because the buried oxide layer (BOX) prevents the substrate to expand to the depletion layer). The SOI power IC devices designed for high voltage below 200V is usually easier than those products designed for high voltage above 600V.

The thickness of the top silicon film in SOI affects the maximum breakdown voltage. When the silicon film is thick, (typically greater than 1 micron), the vertical breakdown voltage increases with silicon film thickness. However, when the silicon film is thin (typically less than 1 micron), the vertical breakdown voltage increases as silicon film thickness decreases. Currently, the most effective techniques for manufacturing above 600V SOI power devices are: first using ultra-thin top silicon (0.2 to 0.5 microns thick) to shorten the ionization integration path to improve maximum vertical breakdown voltage, and second applying linear drift doping to achieve uniform distribution of lateral electric field.

However, due to existing process' limitations, the thickness of the top silicon film in SOI is usually greater than 1 micron. In order to achieve 0.2-0.5 micron thin silicon film, local oxidation of silicon (LOCOS) process is often adopted. But there are some problems with the LOCOS process which requires a long time to oxidize silicon locally for forming about a nearly 2 micron oxide layer, and the formed oxide layer is higher than the top silicon film of about 1 micron thick. In FIG. 1, the oxide layer fabricated 14 in the local region of a SOI substrate (including bottom silicon layer 11, BOX 12 and top silicon layer 13) is higher than the surface of SOI substrate. The higher part of the oxide layer will affect the precision of the follow-up photo-etching process, although the poly silicon gate can be extended on it to control the electric field of the drift region.

In addition, the SOI high voltage control chips usually include high voltage devices and low voltage devices, and the isolation structures between high voltage devices and between high voltage device and low voltage device utilize insulation trenches, while the isolation structures between low voltage devices utilize LOCOS structures.

Therefore, there is an urgent need to effectively combine the trench process and the LOCOS process on a single high voltage SOI chip.

SUMMARY OF THE INVENTION

A method of manufacturing a SOI high voltage power chip, having high voltage power devices and low voltage devices separated by isolating trenches, the method comprising: (a) providing a SOI substrate having a bottom layer, a top silicon layer, and a buried oxide layer in between; (b) forming a cave and trenches respectively in the top silicon layer of the SOI substrate; (c) forming a drift region under the cave by filling oxide in the cave; (d) forming isolation regions near the high voltage power device, by oxidizing the full surfaces of the trenches filling oxide in the oxidized trenches; and forming oxide isolation regions to separate low voltage devices at the same time; (e) forming drain regions, source regions, gate regions for the high voltage power device and the number of low voltage devices by processes including doping, implantation, or depositing; (f) depositing an oxide layer overlapping the drain regions, the source regions, and the gate regions; and (g) forming metal structures respectively connecting to the drain regions, source regions, and gate regions.

After forming the cave and trenches in (b), the remaining thickness of the top silicon layer under the cave is in the range of 0.2-0.5 micrometer, and the remaining thickness of top silicon layer under the trenches is in the range of 0.2-0.5 micrometer.

One exemplary metal structure is a field plate connecting to the gate region of the high voltage power device, the field plate overlaps the cave of the high voltage power device. The field plate has its one end connecting to the gate region, and the other end sits close to the drain region.

An exemplary high voltage power device is a lateral device, such as a Lateral Double Diffused MOS Transistor (LDMOS) or a Lateral Insulated-Gate Bipolar Transistor (LIGBT).

DETAILED DESCRIPTION OF THE EMBODIMENTS

The present invention is further explained in detail according to the accompanying drawings. In the present embodiment, there are a high voltage power device and a low voltage device region in one chip, but the scope of the present invention should also include a chip with a plurality of high voltage power devices and a plurality of low voltage device regions.

A method of manufacturing a SOI high voltage power chip with trenches includes the following steps.

Figure 1:
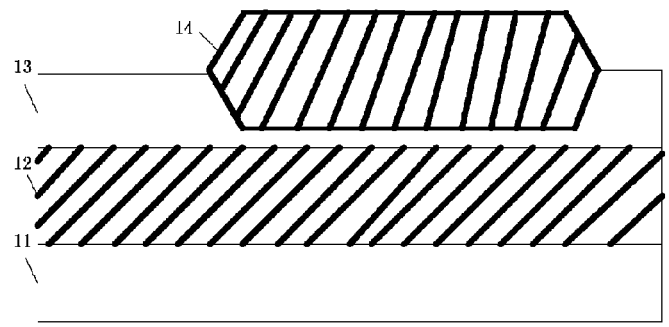
FIG. 1 is a schematic view of a LOCOS structure.
Figure 2A:
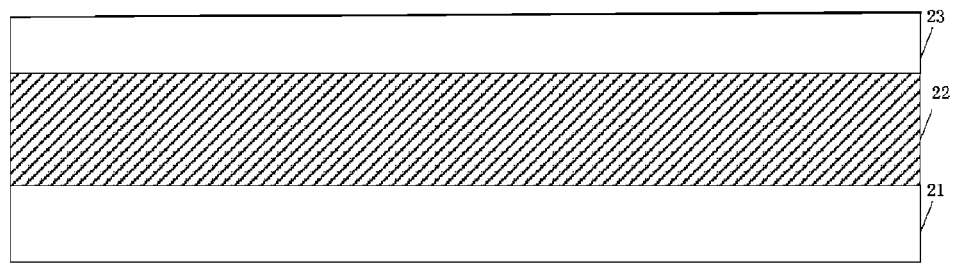
FIGS. 2*a*-2*f* show the manufacturing steps of a SOI high voltage power chip, consistent with some embodiments of the current disclosure.
Figure 2B:
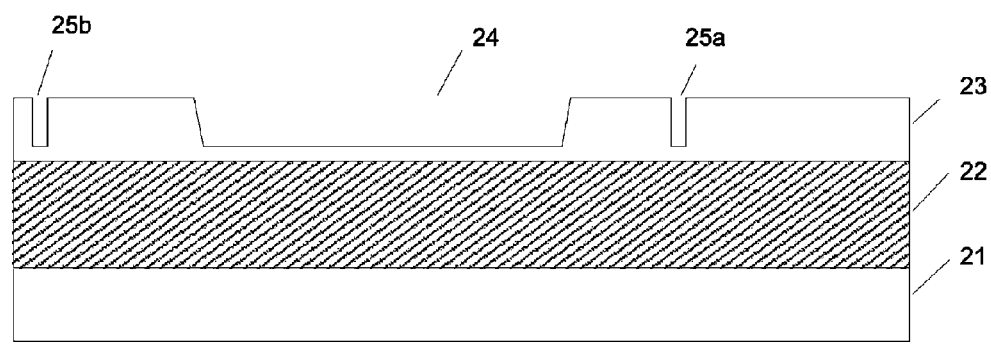

Referring to FIG. 2a, first, a cave and a number of trenches are fabricated simultaneously in the top layer of a SOI substrate to form a drift region and isolation regions of the high voltage power device. The SOI substrate includes a bottom layer 21, a buried oxide layer 22 and a top silicon layer 23. The depth of the cave and the trenches can be determined according to device requirements. Referring to FIG. 2b, in the present embodiment, a cave 24 and trenches 25a, 25b are opened into the top silicon layer of the SOI substrate. The trench 25a is used for isolating the high voltage power device, the trench 25b is used for separating the high voltage power device from the low voltage device region, and the remaining thickness of the top silicon layer under cave 24 and trenches 25a, 25b within 0.2-0.5 micrometer.

Figure 2C:
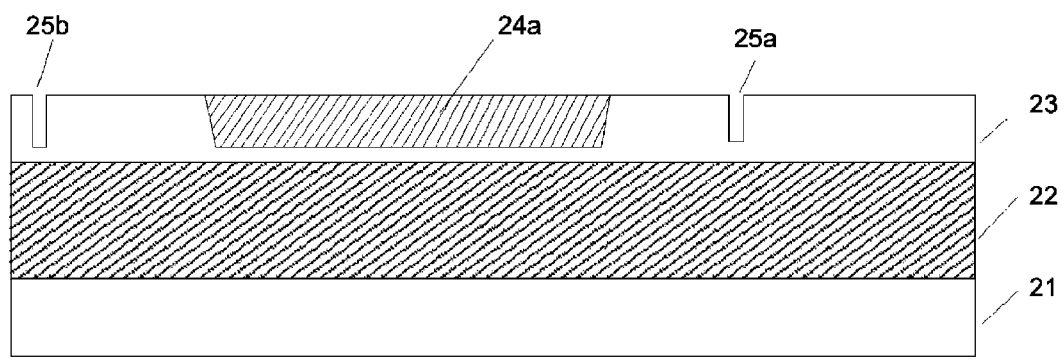

Referring to FIG. 2c, cave 24 is filled with oxide 24a. Oxide 24a could be silicon oxide, silicon nitride, or other insulating materials.

Figure 2D:
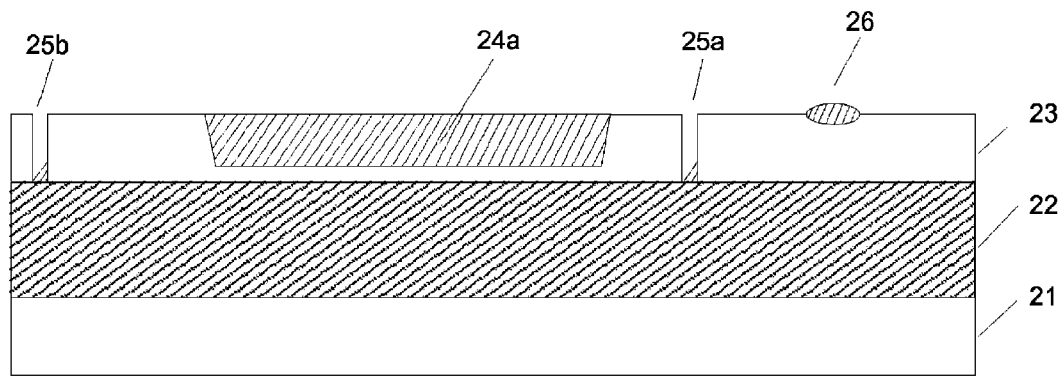

Referring to FIG. 2d, after filling cave 24, trenches 25a and 25b are oxidized such that the oxidation reaches into the buried oxide layer 22 penetrating the local top silicon layer under trenches 25a, 25b. In some situations, the oxidation crosses through a layer of top silicon thicker than 0.5 micrometer. Furthermore, to isolate low voltage devices from each other, oxide isolation regions 26 should be formed at the same time, by oxidizing local surface of the SOI substrate in a LOCOS process.

Figure 2E:
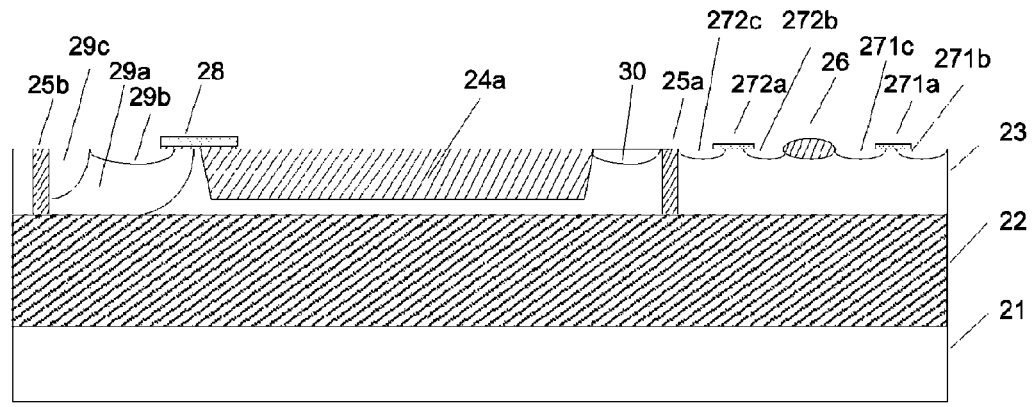

Referring to FIG. 2e, oxide is filled in the oxidized trenches 25a and 25b.

Referring to FIG. 2e, a high voltage power device is formed having a drain region 30, a source region 29b and a gate region 28. And low voltage devices are formed having drain regions 271b, 272b, source regions 271c, 272c, and gate regions 271a, 272a, by processes including doping, deposition, and implantation, etc. The source region of the high voltage power device sits in a doped well region 29a under gate region 28, next to a body contact region 29c. These gate regions could be formed of poly-silicon.

Figure 2F:
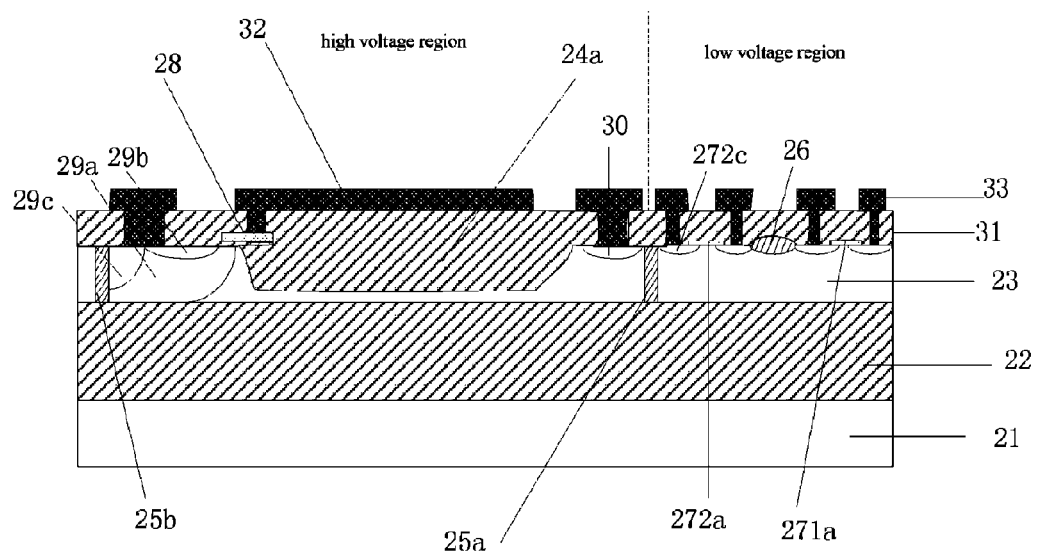

Referring to FIG. 2f, in the next step, an oxide layer 31 is deposited above top layer 23 of the SOI substrate where cave 24, drain regions, source regions, and gate regions reside. Oxides on top of the cave 24, oxide 24a and 31 combined, and oxide below the cave 24, buried oxide layer 22, have about the same thickness.

In the next step, metal structures are fabricated respectively to connect to drain regions, source regions, and gate regions, thus forming the high voltage power device and low voltage device which are separated by trench isolation regions. Referring to FIG. 2f, on the left side of the dash line (the left of trench 25a), there is the high voltage power device, which includes drain region 30, source region 29b, body contact region 29c and gate region 28, and the metal structures formed upon them. For example, metal structure 32 connecting to gate region 28 can be a field plate overlapping cave 24 of the high voltage power device. The field plate's one end connects to gate region 28, and the other end sits close to drain region 30. The right side of trench 25a is a low voltage devices region, which includes two low voltage devices separated by oxide isolation regions 26. One low voltage device includes gate region 271a, drain region 271b and source region 271c, and another low voltage device includes gate region 272a, drain region 272b and source region 272c, and the metal structures formed upon them, for example, metal structure 33 connecting to drain region 271b.

A number of advantages come with the disclosed method of manufacturing a SOI high voltage power chip with trenches. This method skips the thick field oxide growth in a conventional method, but makes full use of multiple oxidization steps in the isolation process, thus reducing the drift region's thickness. As a result, the vertical breakdown voltage performance is improved. The disclosed method simplifies the technological process efficiently, by avoiding long field oxide growth. The method includes forming a cave above the drift region and filling oxide in the cave, at a height basically flush with the top silicon film surface of SOI substrate. The method also includes subsequent lithography steps, deposition of an oxide layer with a predetermined thickness above the drift region, forming oxides at the top and bottom sides of the drift region. In addition, charges in the drift region can be controlled by extending the ii field plate overlapping the drift region, with one end connecting to the poly silicon gate, and the other end sits close to the drain region. As a result, the high voltage power device formed can withstand high voltages above 700V. At the same time, the top oxide layer maintains a flat surface for subsequent accurate lithography.

The above description of the detailed embodiments are only to illustrate the implementations according to the present disclosure, and it is not to limit the scope of the present invention, Accordingly, all modifications and variations completed by those with ordinary skill in the art should fall within the scope of present invention defined by the appended claims.

What is claimed is:

1. A method for manufacturing a SOI high voltage power chip, having a high voltage power device and a number of low voltage devices, the method comprises:
   (a) providing a SOI substrate having a bottom layer, a top silicon layer, and a buried oxide layer in between;
   (b) forming a cave and trenches simultaneously in the top silicon layer of the SOI substrate;
   (c) filling oxide in the cave;
   (d) forming isolation regions near the high voltage power device by oxidizing the full surfaces of the trenches, filling oxide in the oxidized trenches, and forming oxide isolation regions to separate low voltage devices at the same time;
   (e) forming drain regions, source regions, gate regions for the high voltage power device, and the number of low voltage devices by processes including doping, implantation, or depositing;
   (f) depositing an oxide layer overlapping the SOI substrate which comprises the drain regions, the source regions, and the gate regions; and
   (g) forming metal structures respectively connecting to the drain regions, source regions, and gate regions.

2. The method of claim 1, after forming the cave and trenches in (b), the remaining thickness of top silicon layer under the cave is 0.2-0.5 micrometer.

3. The method of claim 1, after forming the cave and trenches in (b), the remaining thickness of top silicon layer under the trenches is 0.2-0.5 micrometer.

4. The method of claim 1, wherein the metal structure connecting to the gate region of the high voltage power device is a field plate, overlapping the cave of the high voltage power device.

5. The method of claim 1, further comprising forming a body region and a body contact region for the high voltage power device.

6. The method of claim 1, wherein the high voltage power device formed is a lateral device.

7. The method of claim 6, wherein the lateral device is a Lateral Double Diffused MOS Transistor or a Lateral Insulated-Gate Bipolar Transistor.

* * * * *